(12) United States Patent
Gojagoji et al.

(10) Patent No.: US 11,545,480 B2
(45) Date of Patent: Jan. 3, 2023

(54) INTEGRATED CIRCUIT WITH SINGLE LEVEL ROUTING

(71) Applicant: TEXAS INSTRUMENTS INCORPORATED, Dallas, TX (US)

(72) Inventors: Sachin Ishwar Gojagoji, Bangalore (IN); Raja Selvaraj, Bangalore (IN); Jayateerth Pandurang Mathad, Bangalore (IN); Sujay Kumar, Udupi District (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 49 days.

(21) Appl. No.: 16/222,670

(22) Filed: Dec. 17, 2018

(65) Prior Publication Data

US 2020/0006317 A1 Jan. 2, 2020

(30) Foreign Application Priority Data

Jun. 29, 2018 (IN) .............................. 201841024233

(51) Int. Cl.
*H01L 27/08* (2006.01)
*H01L 27/02* (2006.01)
(Continued)

(52) U.S. Cl.
CPC ...... *H01L 27/0207* (2013.01); *H01L 27/0802* (2013.01); *H01L 28/24* (2013.01);
(Continued)

(58) Field of Classification Search
CPC ............. H01L 27/0207; H01L 27/0802; H01L 27/101; H01L 2027/11842; H01L 27/1112; H01L 28/20
See application file for complete search history.

(56) References Cited

U.S. PATENT DOCUMENTS 4,500,906 A * 2/1985 Ohno .................... H01L 23/525
257/207
5,059,978 A * 10/1991 Valdenaire .......... H03M 1/0678
341/145
(Continued)

OTHER PUBLICATIONS

Dr. S. L. Pinjare, "Introduction to Analog Layout Design" Jan. 23, 2016, School of ECE, REVA University, Jan. 2016, "http://smdpc2sd.gov.in/downloads/IGF/IGF%201/Introduction%20to%20Analog%20Layout%20Design.pdf" (Year: 2016).*

*Primary Examiner* — Mary A Wilczewski
*Assistant Examiner* — Tsz K Chiu
(74) *Attorney, Agent, or Firm* — Michelle F. Murray; Frank D. Cimino

(57) ABSTRACT

An integrated circuit includes a substrate layer and a resistor bank in a polysilicon layer disposed on the substrate layer. The resistor bank includes a plurality of resistor elements having a body portion extending in a longitudinal direction. A metal line is disposed in a metal layer above the polysilicon layer to extend transverse to the longitudinal direction and across the body portion of a group of the plurality of resistor elements, thereby forming a first region of the resistor bank and a second region of the resistor bank. The first region is separated from the second region by the metal line. A resistor device having a predetermined resistance includes a subset of the resistor elements in the group electrically coupled together in the second region. The resistor device also includes first and second terminals located in the same first or second region of the resistor bank.

20 Claims, 5 Drawing Sheets

(51) Int. Cl.
  *H01L 49/02* (2006.01)
  *H01L 27/10* (2006.01)
  *H01L 27/118* (2006.01)
  *H01L 27/11* (2006.01)

(52) U.S. Cl.
  CPC ......... *H01L 27/101* (2013.01); *H01L 27/1112* (2013.01); *H01L 2027/11842* (2013.01)

(56) References Cited

U.S. PATENT DOCUMENTS

| | | | | |
|---|---|---|---|---|
| 5,093,661 A * | 3/1992 | Tanimoto | ............... | H03M 1/685 341/144 |
| 5,268,651 A * | 12/1993 | Kerth | ............... | H01C 7/22 257/E21.004 |
| 5,343,199 A * | 8/1994 | Sugawa | ............... | H03M 1/0646 341/159 |
| 5,680,132 A * | 10/1997 | Kobatake | ............... | H01L 23/528 341/154 |
| 6,060,760 A * | 5/2000 | Tan | ............... | H01L 27/0802 257/E27.047 |
| 6,777,755 B2 * | 8/2004 | Humphrey | ............... | H01L 27/0285 257/357 |
| 9,691,781 B1 * | 6/2017 | Nishikawa | ............... | H01L 23/5226 |
| 2005/0263850 A1 * | 12/2005 | Aitken | ............... | H01L 27/101 257/E27.071 |
| 2006/0148189 A1 * | 7/2006 | Keum | ............... | H01L 27/0802 257/E27.047 |
| 2006/0249793 A1 * | 11/2006 | Beach | ............... | H01L 27/0802 257/E27.047 |
| 2007/0132507 A1 * | 6/2007 | Gatta | ............... | H03H 11/1282 327/552 |
| 2010/0200952 A1 * | 8/2010 | Tsukamoto | ............... | H01L 27/0802 257/E29.326 |
| 2013/0042216 A1 * | 2/2013 | Loh | ............... | G06F 30/36 716/119 |
| 2013/0127011 A1 * | 5/2013 | Higashitani | ............... | H01L 27/11582 257/532 |
| 2013/0334646 A1 * | 12/2013 | Chen | ............... | H01L 27/0207 257/E27.008 |
| 2014/0118060 A1 * | 5/2014 | Yayama | ............... | G06F 1/08 327/564 |
| 2014/0225220 A1 * | 8/2014 | Tamagawa | ............... | H01L 27/0802 257/529 |
| 2016/0293689 A1 * | 10/2016 | Ma | ............... | H01L 28/20 |

* cited by examiner

INTEGRATED CIRCUIT WITH SINGLE LEVEL ROUTING

This application claims benefit of foreign priority to Indian Provisional Application No. 201841024233 filed Jun. 29, 2018, which application is hereby incorporated herein in its entirety.

TECHNICAL FIELD

This disclosure relates to an integrated circuit and a method for designing the same and, more particularly, to a method for designing an integrated circuit with single level routing.

BACKGROUND

Integrated circuits, including electronic circuits on semiconductor material, are commonly used in a variety of applications such as in computers, televisions, and mobile telephones. Depending on the application, the integrated circuit may be designed according to specific requirements. The design of an integrated circuit includes several steps, including a physical design or layout step in which a circuit pattern is drawn and converted to lithography before being transferred onto silicon. A metal layer is commonly included in the physical design to facilitate electrical connections between components of the circuit. A physical design may include several metal layers connected with vias, depending on the complexity of the design and the number of components included in the design, in order to facilitate the electrical connections when a single metal layer may not be able to provide sufficient surface area to facilitate all of the necessary electrical connections. Including several metal layers in an integrated circuit design, however, may be costly.

SUMMARY

In one example, an integrated circuit includes a substrate layer. The integrated circuit further includes a resistor bank in a polysilicon layer disposed on the substrate layer, the resistor bank comprising a two-dimensional array of a plurality of resistor elements, each resistor element in the resistor bank including a body portion extending in a longitudinal direction between a first end and a second end. The integrated circuit further includes a metal line disposed in a metal layer above the polysilicon layer, the metal line extending transverse to the longitudinal direction and across the body portion of a group of the plurality of resistor elements, thereby forming a first region of the resistor bank and a second region of the resistor bank in which the first region is separated from the second region by the metal line, the first end of each resistor element in the group resides in the first region, and the second end of each resistor element in the group resides in the second region. The integrated circuit further includes a resistor device having a predetermined resistance. The resistor device includes a subset of the plurality of resistor elements in the group electrically coupled together in the second region, a first terminal coupled to at least one first resistor element in the subset in the first region, and a second terminal coupled to at least one second resistor element in the subset in first region.

In another example, a method for fabricating an integrated circuit includes disposing in a polysilicon layer on a substrate layer a resistor bank comprising a two-dimensional array of a plurality of resistor elements. Each resistor element in the resistor bank including a body portion extending in a longitudinal direction between a first end and a second end. The method further includes disposing in a metal layer a metal line above the polysilicon layer extending transverse to the longitudinal direction and across the body portion of a group of the plurality of resistor elements, thereby forming a first region of the resistor bank and a second region of the resistor bank, such that the first region is separated from the second region by the metal line, the first end of each resistor element in the group resides in the first region and the second end of each resistor element in the group resides in the second region. The method further includes forming a resistor device. The resistor device includes a subset of the plurality of resistors in the group, a first terminal coupled to at least one first resistor element in the subset in the first region, and a second terminal coupled to at least one second resistor element in the subset in first region by electrically coupling the subset in the second region.

As yet another example, an integrated circuit includes a substrate layer and a resistor bank that includes a plurality of resistor elements disposed in a polysilicon layer on the substrate layer. The plurality of resistor elements are arranged in at least three columns and a plurality of rows of the resistor elements, each resistor element including a body portion extending in a longitudinal direction in a respective row between a first end and a second end. A metal connector is disposed in a metal layer over the polysilicon layer to electrically couple each of the resistor elements in a given row of the plurality of rows in series to provide a routing connection across the given row of the resistor bank.

As another example, a method for fabricating an integrated circuit includes disposing in a polysilicon layer on a substrate layer a resistor bank that includes a plurality of resistor elements. The plurality of resistor elements are arranged in at least three columns and a plurality of rows of the resistor elements, each resistor element including a body portion extending in a longitudinal direction of a respective row between first and second ends thereof. The method also includes disposing metal couplings in a metal layer over the polysilicon layer to electrically connect each of the resistor elements in a given row of the plurality of rows in series to provide an electrical routing path across the given row of the resistor bank.

DETAILED DESCRIPTION

Figure 1:
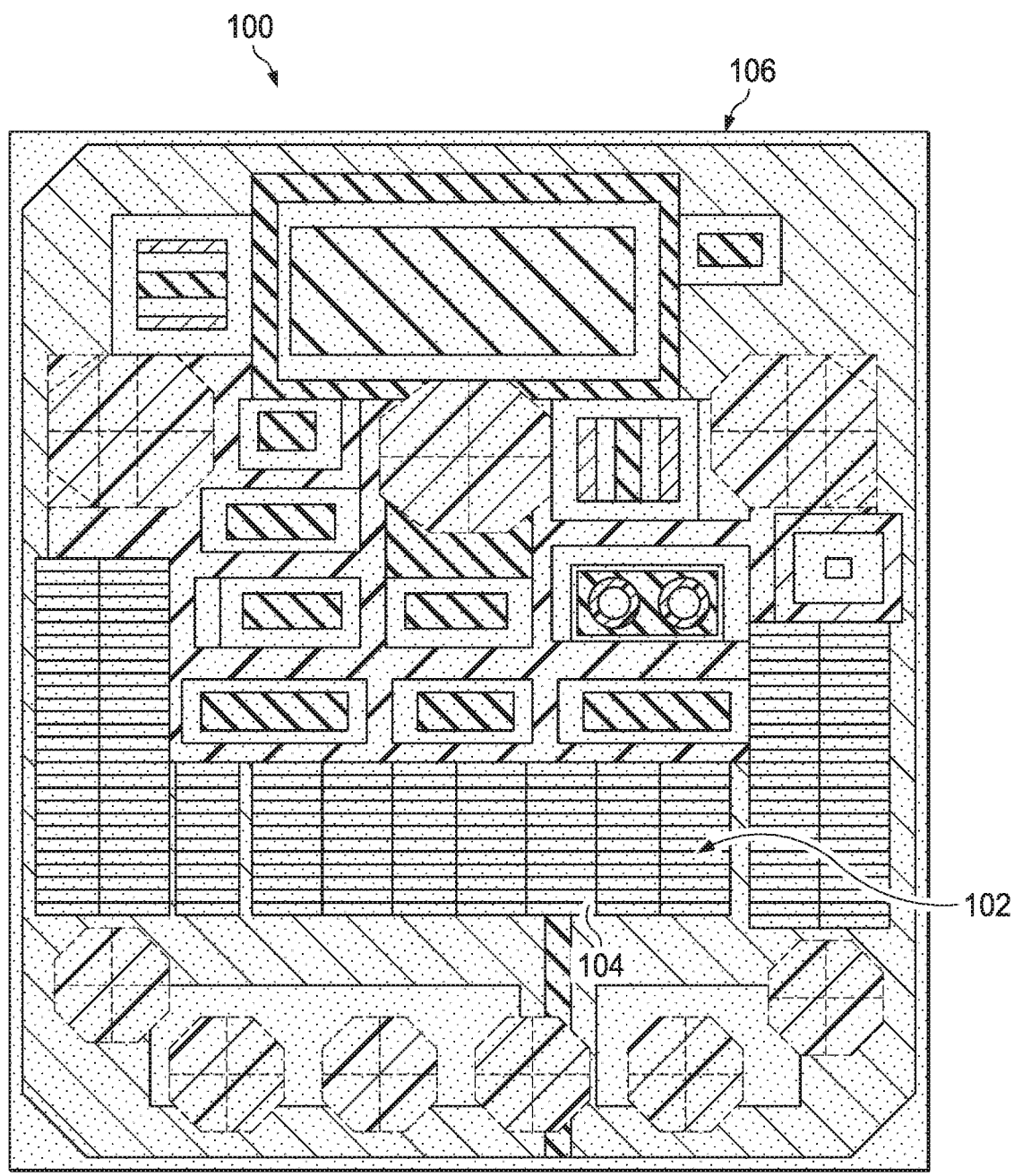
FIG. 1 illustrates an example integrated circuit design layout.

This disclosure relates to a method for designing an integrated circuit (IC) with routing in a common layer. For example, an IC with single level routing enables elimination of extra metal layers, thereby reducing the overall cost of manufacturing the integrated circuit.

An integrated circuit with single level routing, as will be described herein, utilizes a novel approach for routing in order to alleviate the disadvantages described. In particular, an integrated circuit with single level routing described herein utilizes unit resistors within a resistor bank as a means for routing within or through the resistor bank. As a result, routing may be achieved without using a poly jumper and without blocking routing access to remaining portions of a circuit.

In one example, an IC includes one or more metal lines disposed on a metal layer (e.g., part of a single routing layer) such as extending in a direction that is transverse to the body portion of a group of the resistor elements, such that the ends of such resistor elements in the group reside on opposite sides of the metal line. For example, one end of each resistor element in the group resides on a first side of the metal line and the second end of each resistor elements resides on a second side of the metal line. The IC is configured to include a resistor device that is formed from resistors in the group to have a predetermined resistance. For example, a subset of the plurality of resistor elements are electrically coupled (e.g., by connections in the metal layer) on the second side of the metal line. The resistor device includes respective terminals on the same side of the metal line. As a result, connections can be made to each of the resistor terminals (e.g., in the same metal layer as the metal line) without having to cross the metal line.

In another example, an IC includes a resistor bank that includes at least three columns of resistor elements and a plurality of rows. The resistor elements are arranged as extending along the rows. A metal connector is disposed in a metal layer over the resistive layer to electrically couple each of the resistor elements in a given one of the plurality of rows in series to provide a routing connection across the given row of the resistor bank. By providing the routing connection using resistor elements across a given the row, rather than use a metal layer itself across the row, access to circuitry is facilitated (e.g., through the body of resistor elements) without having to cross a metal layer.

Designers and manufacturers of integrated circuits are increasingly facing requirements for reducing costs in order to be more competitive in the marketplace. One approach for reducing the cost of an integrated circuit design is to reduce the die cost, such as by implementing routing in a single level metal layer of the IC. Eliminating extra metal layers, according to the example embodiments disclosed herein, also eliminates the need for vias interconnecting multiple metal layers, which further reduces overall cost. Eliminating extra metal layers and reducing an integrated circuit design to a single level metal layer may be challenging, however. For example, it may be challenging to route all necessary electrical connections to components on a substrate layer using a single level metal layer given certain IC design requirements.

By way of example, FIG. 1 illustrates an example IC design layout 100. The layout 100 includes a bandgap stage 102, which may be disposed on a substrate layer 106. The bandgap stage 102 include a number of bandgap resistors 104 that are implemented as unit resistors. As will be shown, the bandgap resistors 104 are distributed within a middle portion of a resistor bank that extends between side edges of the IC layout 100. The arrangement of the bandgap resistors in the layout 100 can reduce output voltage variation.

Figure 2:
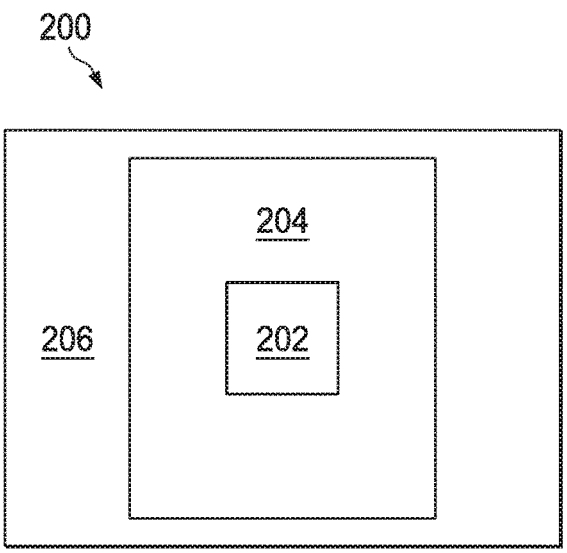
FIG. 2 illustrates a block diagram of an example bandgap stage resistor bank.

As a further example, FIG. 2 illustrates a block diagram of an example bandgap stage resistor bank 200 (e.g. corresponding to the bandgap stage 102 of FIG. 1). For example, the resistor bank 200 resides in a polysilicon layer (e.g., a polycrystalline silicon material) and includes a number of unit resistors (e.g. the bandgap resistors 104 of FIG. 1). In particular, the bandgap stage resistor bank 200 includes current setting resistors 202 positioned in the middle of the bandgap stage resistor bank 200. Proportional to absolute temperature ("PTAT") resistors 204 surround the current setting resistors 202. Trim resistors 206 surround the PTAT resistors 204. Given such design requirements for generating a precision reference (e.g., based on a bandgap voltage) in order to reduce output voltage variation, it tends to be difficult to route all necessary connections using a single level metal layer above the polysilicon layer containing current setting resistors 202, PTAT resistors 204 and trim resistors 206.

Figure 3:
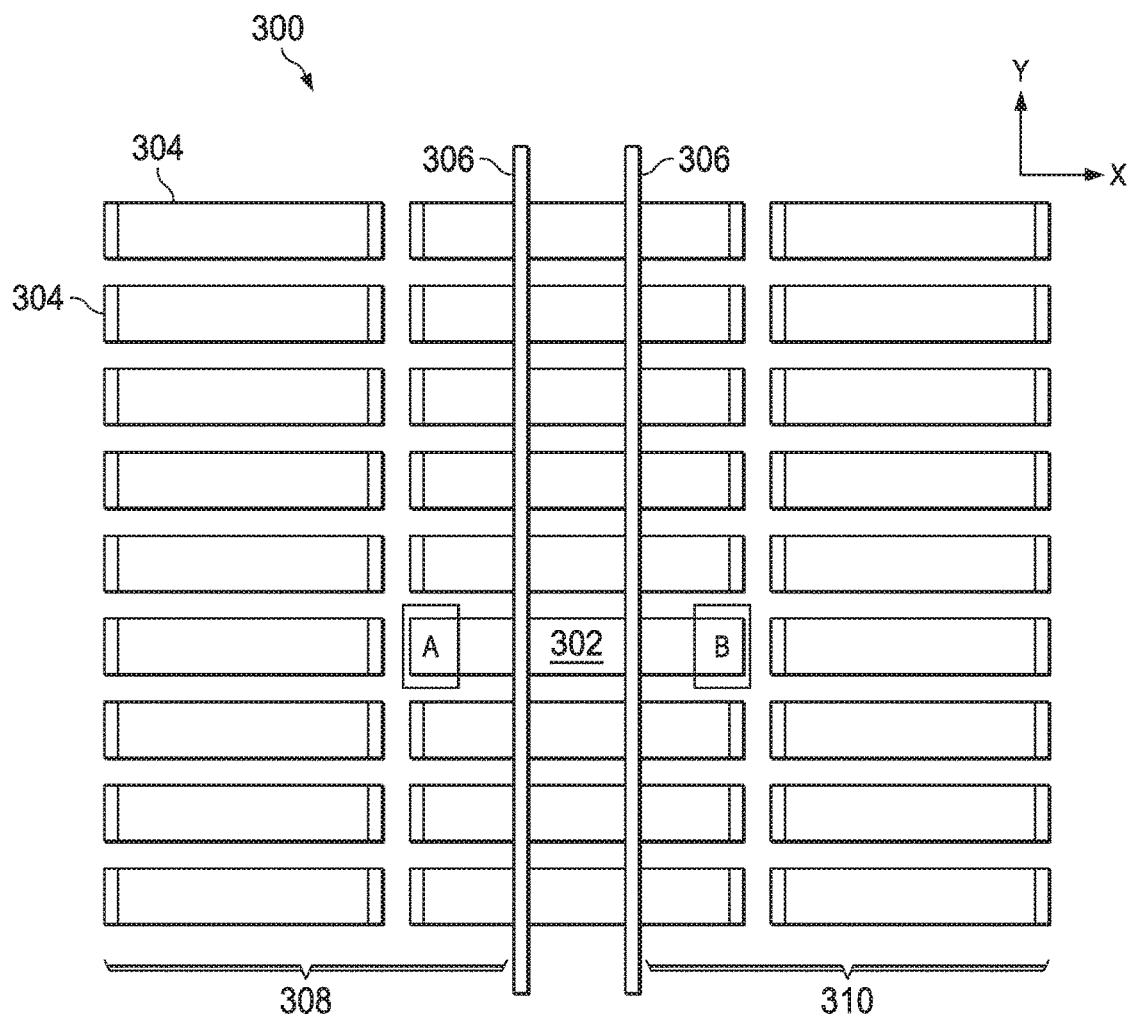
FIG. 3 illustrates a block diagram of an example resistor bank.

By way of example, FIG. 3 illustrates a block diagram of an example resistor bank 300. As shown in FIG. 3, the resistor bank 300 includes a plurality of resistor elements 304 arranged in a plurality of rows and columns. In one example, the resistor elements 304 are polysilicon unit resistors (poly-resistors), each having a prescribed resistance, which may be the same of different. Each of the unit resistors includes respective ends (with respective contacts) spaced apart from each other by an elongate body portion. Each of the elongate body portions is arranged to extend longitudinally in an X-direction in a respective row and column of resistor bank 300. In this example, there are three columns and a number of rows. Other numbers of rows and columns may be used in other examples.

Each of the ends of a resistor element may be electrically connected to other resistors or to terminals via an electrically conductive jumper (e.g., a metal jumper formed in the metal layer of the IC). One or more metal lines 306 are disposed in the metal layer over a polysilicon layer containing the resistor elements. As shown in the example of FIG. 3, the metal lines 306 extend (in a Y-direction) transverse to the longitudinal direction and across the body portion of a group of the plurality of resistor elements (e.g., a central column of resistor elements). The metal lines 306 thus divide the resistor bank 300 into respective spatial regions, in which a first region 308 of the resistor bank resides on one side of the metal lines and a second region 310 of the resistor bank resides on the other side of the metal lines. That is, the first region 308 is separated from the second region 310 by the metal line. In this way, the first end of each resistor element in the group (e.g., the middle column of resistors) resides in the first region 308, and the second end of each resistor element in such group resides in the second region 310. The metal line (or lines) 306 may be fabricated as part of a single metal layer in which components formed in such layer share the same materials and/or process steps. In this way, ends of the given resistor 302 reside on opposite sides of a particular metal line 306. While the given resistor 302 is demonstrated as a single unit resistor element in the example of FIG. 3, in other examples (see, e.g., FIG. 4), more than one resistor element 304 may be connected together via corresponding jumpers to form a resistor having a desired aggregate resistance.

As a further example, a first end A of the given resistor 302 is disposed on a first side 308 of the metal lines 306 and a second end B of the given resistor 302 is disposed on a second side 310 of the metal lines 306. It may be desirable to have a connection to the second end B on the same side as or proximate to a connection to the first end A for various design purposes. For example, it may be desirable to electrically connect both ends A and B of the given resistor 302, using metal layer connections, to one or more other resistor elements 304 or other circuitry positioned on a common side of the metal lines 306. This is to avoid having to utilize another metal layer to make such connections. However, because the vertical metal lines 306 cross the resistor bank 300 in between the first end A and the second end B of the given resistor 302, it may be difficult (if not impossible) to bring the connection to the second end B onto the same side as the connection to the first end A using a single level metal layer without crossing the one or more metal lines 306. If a second metal layer is needed to make such connections, the fabrication cost for the device and process time increases accordingly. The approach disclosed herein thus enables a reduction in processing steps and associated costs.

Figure 4:
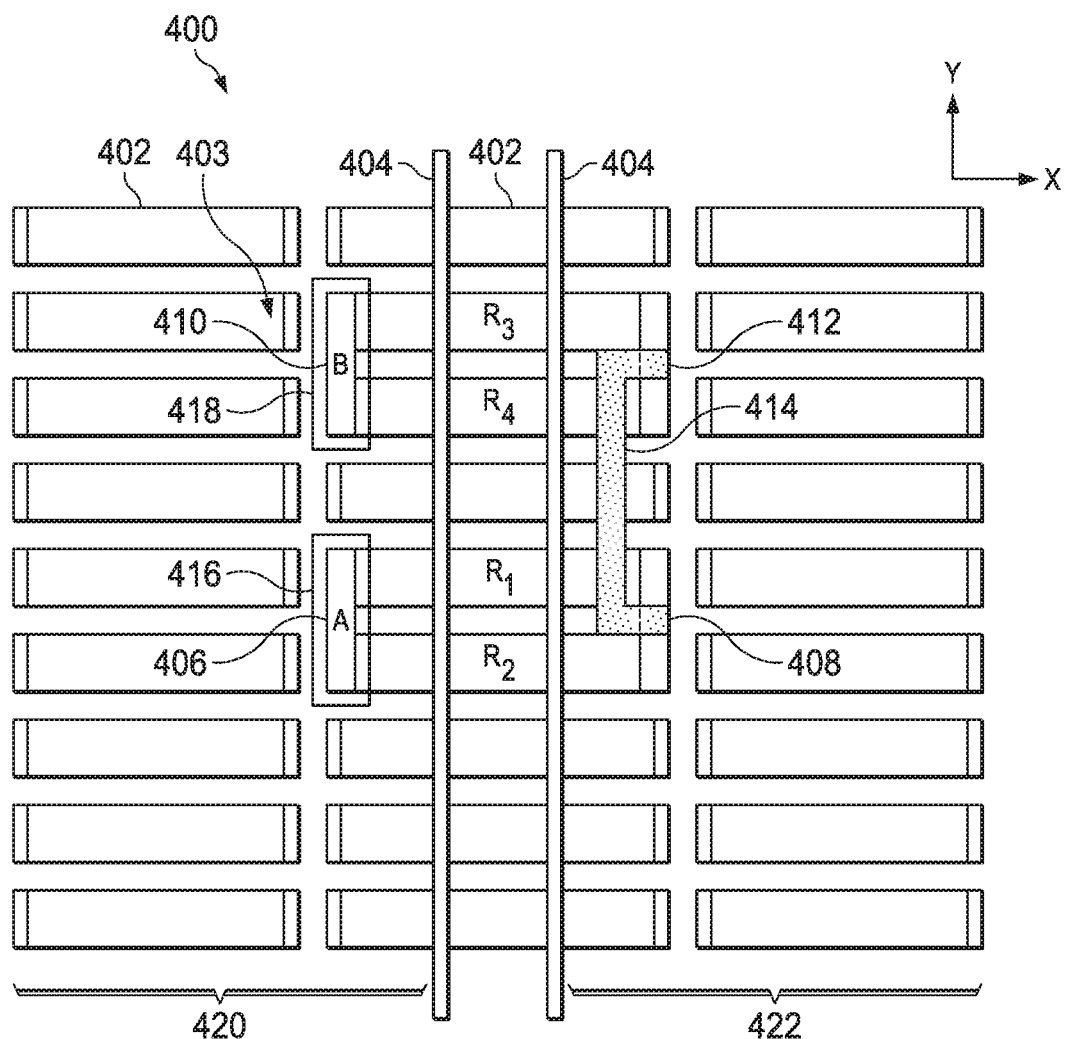
FIG. 4 illustrates a block diagram of another example resistor bank.

FIG. 4 illustrates a block diagram of another example resistor bank 400 that includes a plurality of resistor elements 402. The resistor bank of FIG. 4 includes a plurality of resistor elements arranged in a plurality of rows and one or more columns—three columns in this example. In this example, a plurality of interconnected resistor elements 402 are connected together (e.g., via metal jumpers) to form a given resistor 403. The given resistor 403 thus includes resistor elements 402 configured as a resistor circuit having a known resistance to replace a resistor (having the same resistance). Additionally, the given resistor has ends 416 and 418, corresponding to nodes A and B, respectively, that reside on a common side of one or more metal lines 404.

The resistor bank 400 may be configured as described with respect to FIG. 3. For example, the resistor bank 400 may be disposed on a substrate of an IC chip and includes the resistor elements 402 arranged in rows and columns. Each resistor element includes a body portion extending longitudinally in an X-direction of respective columns, as disclosed with respect to FIG. 3. The one or more metal lines 404 reside in a metal layer of the IC chip extend transversely (in a Y-direction) to the longitudinal direction of the body portions of resistor elements, which in this example crosses over the body portions of resistor elements in a respective column (e.g., the central column of resistor elements). The metal lines 404, thus divide the resistor bank 400 into a first spatial region 420 located on one side of the metal lines 404 and a second spatial region 422 located on the opposite side of the metal lines. As a result, different subsets of resistor elements 402 reside on opposite regions 420 and 422 of the metal lines 404 (e.g., located in a first column on the first region 420 and in a third column on the second region 422 in the resistor bank 400). Additionally, opposite ends of each of the resistor elements 402 in the central column, across which the metal lines 404 pass, are located on opposite sides (i.e. the first region 420 and the second region 422) of the metal lines 404. Although the example resistor bank 400 includes three columns of resistor elements 402, in other examples, the resistor bank 400 may include any different number of columns of resistor elements 402, which may include more or less columns. In addition, the resistor bank 400 may include any number of one or more metal lines 404 (e.g., in a respective metal layer).

In this example, a given resistor element (a unit resistor) having its ends on opposite sides of the metal lines 404 is replaced by a resistor circuit that includes group of resistor elements, demonstrated as resistors R1, R2, R3 and R4. In this example, the resistors R1, R2, R3 and R4 in the resistor circuit 403 coupled between ends 416 and 418 are configured to have a known aggregate resistance equivalent to a single resistor element (e.g., resistor element 302).

Figure 5:
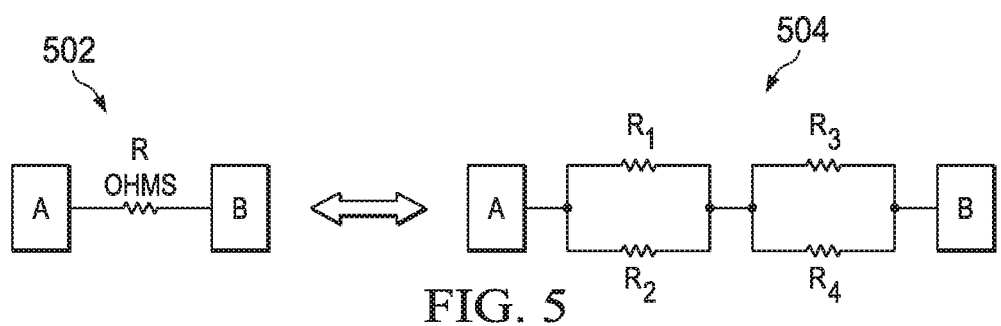
FIG. 5 illustrates a circuit diagram of an example resistor circuit.

As a further example, FIG. 5 illustrates a first resistor circuit 502 having a single resistor R with a known resistance value of R ohms between first end A and second end B. The resistor circuit 502 may be replaced with a second resistor circuit 504 having the same equivalent resistance value of R ohms between first end A and second end B by an arrangement of resistors. In this example, four resistors (e.g., unit resistors) R1, R2, R3, and R4 in the circuit 504 are configured to replace of the resistor R in the circuit 502, where R1=R2=R3=R4=R. In particular, the second resistor circuit 504 includes two resistors R1 and R2 connected in parallel, which are connected in series with two additional parallel-connected resistors R3 and R4. This is based on the well-known principal that the total resistance of resistors connected in parallel is equal to the product of the resistance divided by the sum. Thus, in the example illustrated in FIG. 5, $R=(R1*R2)/(R1+R2)+(R3*R4)/(R3+R4)$. Because the overall resistance of resistor circuit 502 between ends A and B is equal to the overall resistance of resistor circuit 504 between ends A and B, the first resistor circuit 502 can be replaced with resistor circuit 504 within a larger circuit design without affecting the functionality of the larger circuit.

Referring back to FIG. 4, and applying the example resistor circuit substitution illustrated in FIG. 5, the given resistor 403 is formed of four resistor elements R1, R2, R3, and R4 of the resistor bank 400. For example, the given resistor 403 is coupled as a series of two parallel resistor pairs, as described, to achieve the equivalent resistance as an original resistor (e.g., one or more resistor elements) while providing both the first end 416 and the second end 418 (illustrated as nodes A and B) of the given resistor 403 on a common region 420 with respect to the metal lines 404. As an example, a first end of resistor R1 is coupled to a first end of resistor R2 on the first region 420 of the metal lines 404 at by an electrically conductive coupling 406 (e.g., jumper in a metal layer of the IC) to form the first end node A of an overall resistor circuit 403 connected between end nodes A and B. Second end of resistor R1 is coupled to the second end of resistor R2 on the second side 422 of the metal lines 404 by coupling 408 (e.g., jumper in the metal layer of the IC), such that resistors R1 and R2 are coupled in parallel. Similarly, a coupling 410 (e.g., a metal layer connection in the IC) couples a first end of resistor R3 to a first end of resistor R4 on the same side region 420 of the metal lines 404 as coupling 406 by to provide the end node B of the resistor circuit 403. Another coupling 412 couples the second ends of resistor R3 and R4 on the other side 422 of the metal lines 404. In this way, the resistors R3 and R4 are connected in parallel to extend between opposing sides 420 and 422 of the resistor bank. To complete the connection, another coupling 414 electrically couples couplings 408 and 412 to form a series connection between the first parallel set of resisters R1 and R2 and the second parallel set of resistors R3 and R4.

As a result of this configuration, the circuit has the equivalent resistance as a given resistor element (e.g., unit resistor). In other examples, the resistor circuit 403 can be configured have a different known resistance. Additionally, this configuration enables end nodes A and B of the resistor circuit 403 to reside on the same side (i.e. the first side region 420) of the metal lines 404. Consequently, connections to the ends A and B of the resistor circuit can be routed in a single level metal routing layer to the same side without disturbing the metal lines 404, without requiring a poly jumper and without requiring additional area on a die. As mentioned, poly jumpers may affect the overall resistance causing further variation in precision circuitry, such as involving bandgap reference voltage circuitry. Thus, the routing disclosed herein may be utilized in circuits designed to generate a bandgap reference voltage (e.g., it can be implemented in the circuit 100 of FIG. 1).

Although the example resistor bank 400 illustrates a replacement resistance circuit including two resistors in parallel coupled in series with another two parallel resisters (e.g., 2×2 resistor circuit), any number of resistor elements may be connected in a similar manner to provide a resistor circuit having a desired equivalent resistance with end nodes A and B on a common side region 420 or 422 of one or more metal lines 404 that extending across and transverse to the longitudinally extending body portions of the resistor elements. For example, the resistor circuit 403 may be extended to include any number of resistors connected in parallel and/or series (e.g. a 3×3 resistor circuit, a 4×4 resistor circuit, and so on) to position ends of the resistor circuit on a common side region 420 or 422 provided by the metal lines 404. In an example, a resistor bank (not shown) may include four or more columns of resistor elements including metal lines disposed over (passing over multiple central columns of resistor elements. It may be desirable to route a connection from a first end of a first resistor element in a first center column on a first side of a first metal line to a second end of a second resistor element in a second center column on a second side of a second metal line. In such an example, the first resistor in combination with the second resistor may be substituted with a 3×3 or a 4×4 resistor circuit.

Figure 6:
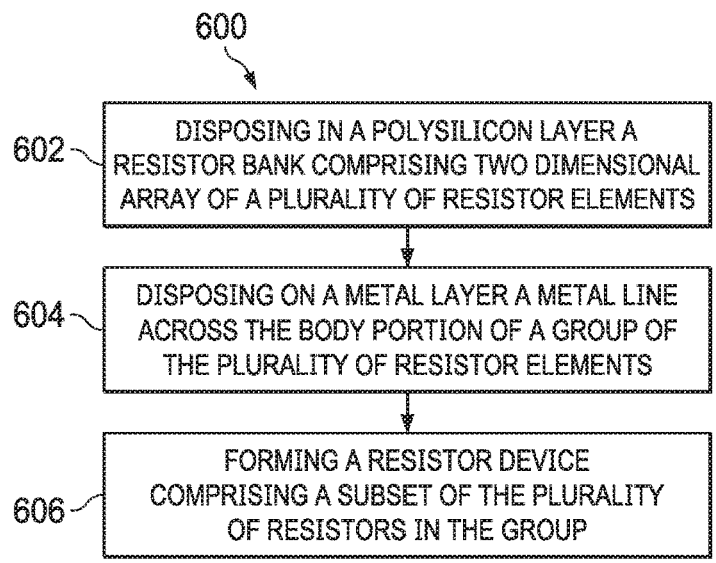
FIG. 6 is a flow chart illustrating an example method for fabricating an integrated circuit.

In view of the structural features described above, an example method for making a resistor device will be better appreciated with reference to FIG. 6. While, for purposes of simplicity of explanation, the method of FIG. 6 (as well as FIG. 9) is shown and described as executing serially, it is to be understood and appreciated that the method is not limited by the illustrated order, as parts of the method could occur in different orders and/or concurrently from that shown and described herein.

FIG. 6 illustrates an example method 600 for fabricating an IC chip with single level routing using resistor replacement. At 602, a resistor bank (e.g., bank 400) is disposed in polysilicon layer on a substrate of the IC chip. The resistor bank include a two-dimensional array of a plurality of resistor elements (e.g., elements of FIG. 4). Each resistor element in the resistor bank includes a body portion extending in a longitudinal direction between a first end and a second end thereof. At 604, one or more metal lines are disposed in a metal layer (e.g., metal line 404 in a single metal routing layer of the IC) extending transverse to the longitudinal direction and across the body portion of a group of the plurality of resistor elements, thereby forming a first region of the resistor bank and a second region of the resistor bank, such that the first region is separated from the second region by the metal line. Thus, the first end of each resistor element in the group resides in the first region and the second end of each resistor element in the group resides in the second region.

At 606, a resistor device (e.g., resistor 403) is formed. The resistor device includes a subset of the plurality of resistor elements in the group. A first terminal is coupled to at least one first resistor element in the subset in the first region and a second terminal is coupled to at least one second resistor element in the subset in first region by electrically coupling the subset in the second region. As a result, the resistor device can have a desired resistance and have each of its end terminals on the same side of the metal line to facilitate routing connections to such end terminals using the single level routing layer.

In one example, the resistor device is formed by electrically coupling N resistor elements (e.g., unit resistors) in the group in parallel to define a parallel resistor network and electrically coupling N parallel resistor networks in series, N being positive integer greater than or equal to two. For example, each of the resistor elements are unit resistors having a prescribed resistance, the resulting resistor device can have the equivalent resistance that is a multiple of the unit resistor.

In some examples, the first end of each resistor element in each parallel resistor network is electrically coupled and the second end of each resistor element in each respective parallel resistor network is also electrically coupled together. For example, the coupling is implemented by metal jumpers (e.g., jumpers 406, 408, 410, 414) formed in the metal layer.

As another example, the plurality of resistor elements are disposed such that the body portion of each resistor element extends in a common longitudinal direction (e.g., in the X-direction) between the first and second ends thereof. The metal line can be disposed such that the metal line extends in a direction that is transverse to the common longitudinal direction and through the body portion of resistor elements in given column (see, e.g., FIG. 4).

Figure 7:
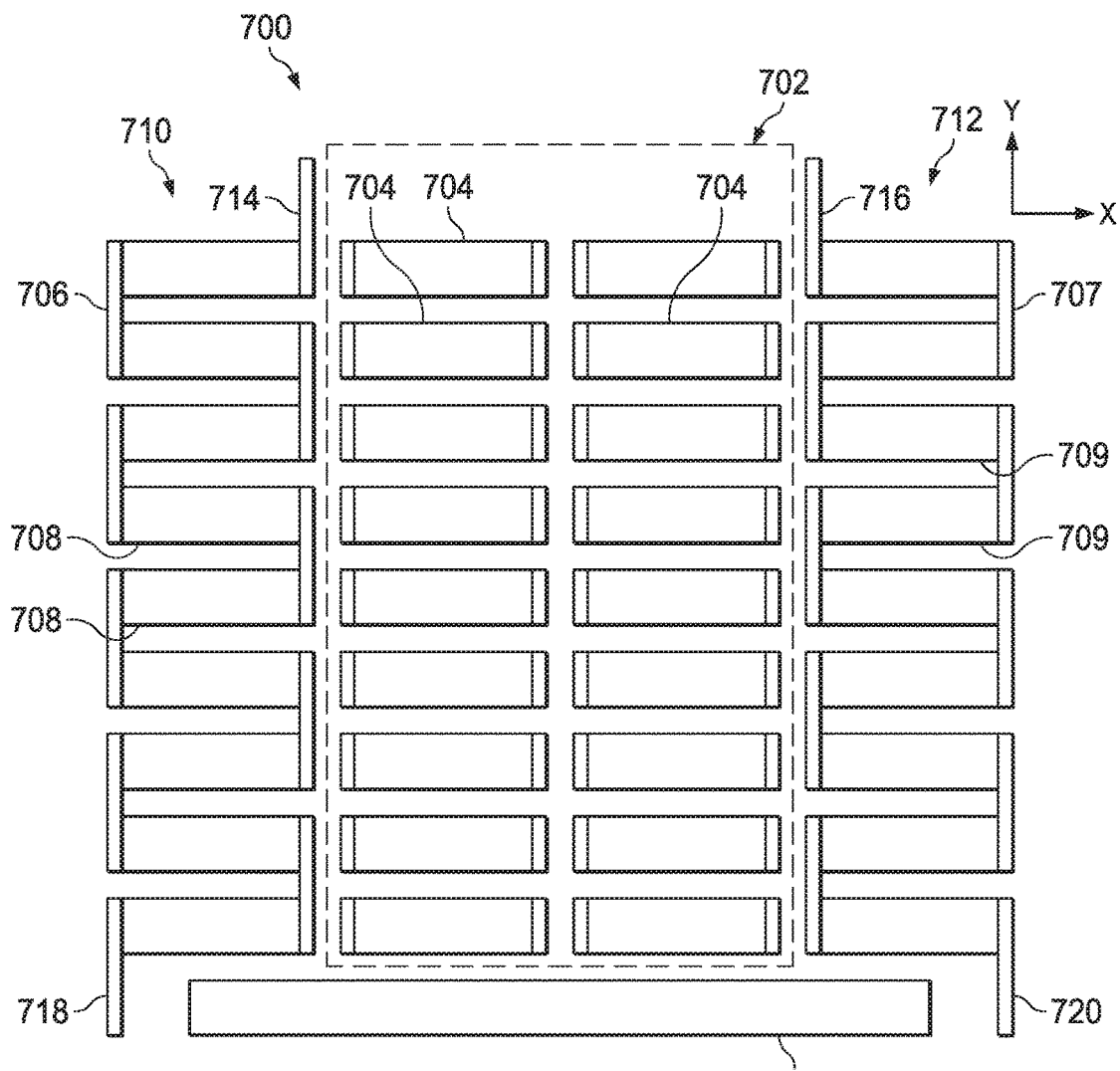
FIG. 7 illustrates a block diagram of another example resistor bank.

FIG. 7 illustrates a block diagram of another example resistor bank 700 that may be implemented in an IC layout (e.g., layout 100 of FIG. 1). The resistor bank 700 may include a main resistor bank 702, including a plurality of main resistor elements 704 (e.g., poly resistors as disclosed herein). In an example, the main resistor bank 702 includes two or more columns of the main resistor elements 704. The resistor bank 700 may include a second resistor bank 710, such as another column of first side resistor elements 708. In this example, the resistor elements 708 are connected in series by first side metal layer connections 706 (e.g., in a single level metal layer). The second resistor bank 710 has a first end node 714 and a second end node 718, corresponding to respective metal layer connectors. The resistor bank 700 may further include a third resistor bank 712 on a second side of the main resistor bank 702 that is opposite the second resistor bank 710. The third resistor bank 712 is demonstrated as another column of second side resistor elements 709 arranged adjacent the opposite side of the main bank 702. The resistor elements 709 are connected in series by second side metal layer connections 707. The third resistor bank 712 has a first end node 716 and a second end node 720.

In some examples, such as to implement a particular circuit design specification, it may be desirable to not disturb the resistor elements 704 in the main bank 702. It may also be desirable to couple the second node 718 of the second resistor bank 710 with second node 720 of the third resistor bank 712 such that the second resistor bank 710 and the third resistor bank 712 form a single combined resistor circuit having end nodes 714 and 716. However, because circuit design specifications may preclude the main resistor bank 702 from being disrupted, such as to provide access through the main bank to other circuitry 722 that is located below the main bank, it may be difficult to provide routing between the second node 718 of the second resistor bank 710 and the second node 720 of the third resistor bank 712 to form the single combined resistor bank using a single level metal layer without blocking access to other circuitry 722 in the IC. For example, a laterally extending metal layer connection between nodes 718 and 720 would block desired access to the other circuitry 722 via metal layer connection in the Y-direction through the main resistor bank 702.

Figure 8:
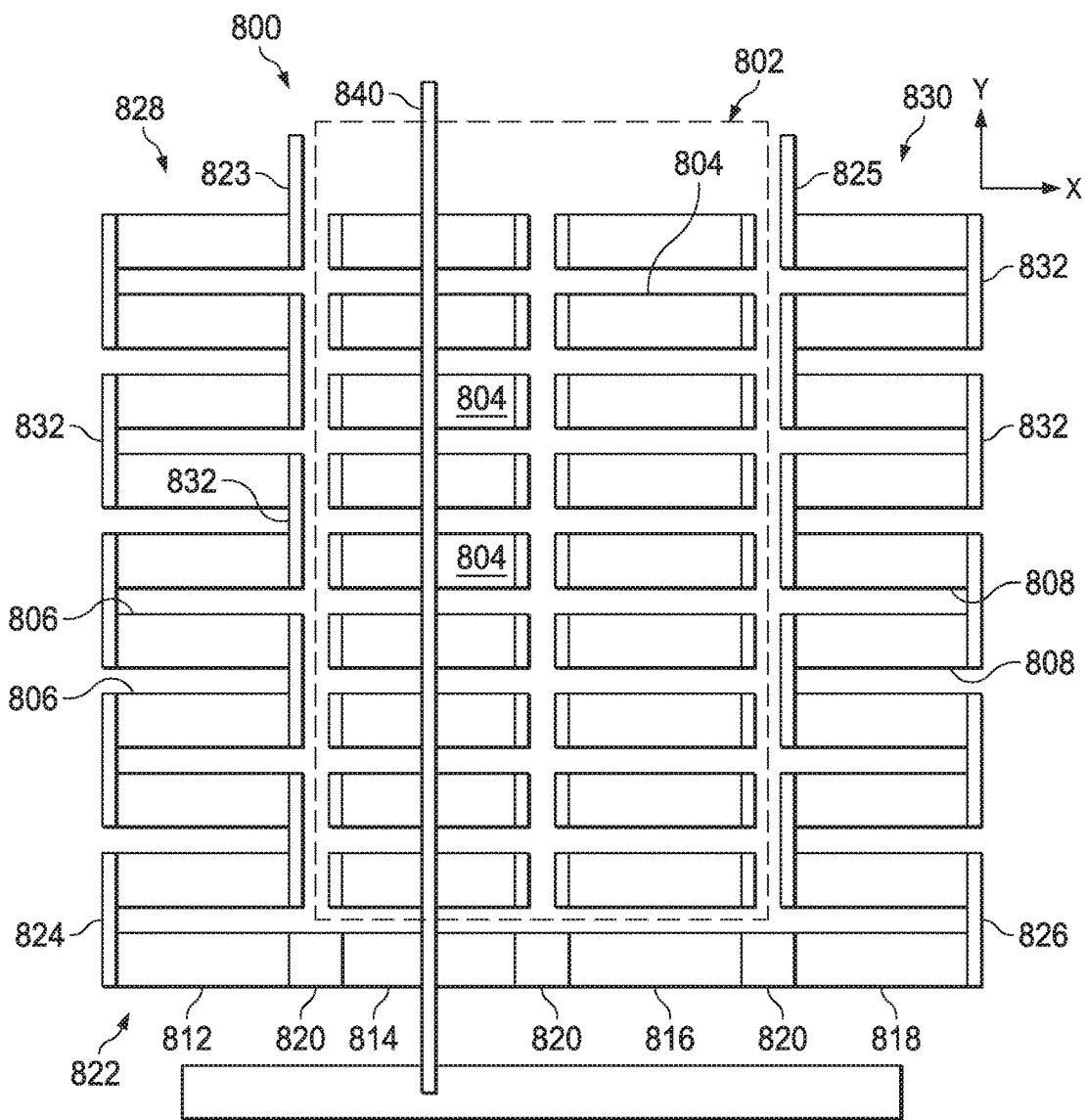
FIG. 8 illustrates a block diagram of another example resistor bank.

FIG. 8 illustrates another example resistor bank 800 that employs resistor elements configured to provide a routing path 822 that interconnects spaced apart nodes (e.g., nodes 718 and 720) of a resistive circuit on an IC chip. The resistor bank 800 may be disposed on a substrate layer of the IC chip and include resistor elements 804 disposed in a polysilicon layer on the substrate layer. In this example, the resistor elements 804 are arranged in a two-dimensional array of rows and columns (e.g. four columns). Each resistor element 804 includes a body portion extending longitudinally (e.g., in the X-direction) in a respective row between first and second ends thereof, each end providing a contact (e.g., in a metal layer disposed over the polysilicon layer). Each resistive element 804 can be a unit resistor having a known resistance, which may be same or vary within the bank 800. As described in FIG. 7, resistor elements in each of the end columns, which surround a central main resistor bank, are electrically connected together by electrically conductive couplings 832 (e.g., in a metal layer of the IC). In this example, the couplings 832 are disposed in the metal layer over ends of adjacent pairs of resistive elements as to connect each of the resistor elements in the respective end columns of the bank 800 in series between its end nodes. For example, each of the couplings and end nodes (e.g., shown as top nodes 823 and 825 and bottom nodes 824 and 826) are in the metal layer.

By way of example, the resistor bank 800 includes a main resistor bank 802, including several main resistor elements 804 arranged in the two center columns of the bank. As mentioned, the resistor elements in the main resistor bank 802 are to remain undisturbed (e.g., according to a particular circuit design specification), such as to enable metal layer routing over the body portions of main bank resistor elements 804 to connect to other circuitry 810 in the IC. The resistor bank 800 includes a second resistor bank 828 spaced laterally (e.g., in the X-direction) from the main resistor bank 802. The second bank 828 includes a plurality of resistor elements 806, which may be unit resistors having the same (or different) resistance as the resistor elements 804 in the main bank 802. The second resistor bank 828 has a first end node 823 at a top of the column and a second end node 824 at a bottom of the column. The resistor elements 806 are connected together in series between the ends nodes 823 and 824 by metal layer connections 832. The resistor bank 800 also includes a third resistor bank 830 on an opposite side of the main resistor bank 802, such that the second and third banks 828 and 830 sandwich the central main bank 802. The third bank includes a plurality of resistor elements 808, which may be unit resistors having the same (or different) resistance as the resistor elements 804 in the main bank 802. The third resistor bank 830 has a first end node 825 and a second end node 826. Each of the resistor elements 808 is connected in series between the ends nodes 825 and 826 by the electrically conductive couplings 832 (e.g., in the metal layer).

As mentioned, the routing path 822 provides a connection between the second end node 824 of the second resistor bank 828 and the second end node 826 of the third resistor bank 830 by electrically connecting resistor elements from each of the banks 802, 828 and 830. For example, the routing path 822 is formed by connecting adjacent ends of resistor elements 812, 814, 816 and 818 using electrical couplings 820 (e.g., in the metal layer) to interconnect respective ends of the resistor elements. The routing path 822 between ends nodes 824 and 826 thus connects each of the resistor elements in such row in series without disturbing the main resistor bank 802 and without blocking access to other circuitry 810 through the main bank 802. The resistor elements 812, 814, 816 and 818 thus provide the resistor routing path 822 interposed between the main resistor bank 802 and the other circuitry 810 to circumvent the main resistor bank 802. For example, the path 822 includes resistors in a given row of the bank 800. The resistor routing path 822 is coupled to node 823 through the resistive path formed by the resistor elements 806 of resistor bank 828 and is coupled to the other node 825 through the resistive path formed by resistor elements 808 of the third bank 830. In this way, a resistor circuit (having a known resistance) is formed between nodes 823 and 825 while affording access to the other circuitry 810 through a metal layer connection 840 that can be provided over the body portion of resistor elements 804 in the main bank 802.

The type of connections (e.g., series and/or parallel) between resistor elements in the resistor circuit between end nodes 823 and 825 can be designed to have a desired resistance (e.g., a bandgap resistance) according to design application requirements. In one example, to compensate for the additional resistance that may be introduced as a result of incorporating the additional resistor routing path 822 that includes series resistors 812, 814, 816 and 818 (in place of a metal line), the connections between resistor elements in the side banks 828 and 830 may be adapted accordingly. In the example where the routing resistors includes four resistor elements, a corresponding number of secondary resistor elements 808 (e.g., four) may be shorted (e.g. bypassing two secondary resistor elements 808 on the second resistor bank 828 and two secondary resistor elements 808 on the third resistor bank 830) to balance the overall resistance of the newly formed routing path and to provide the overall resistance the same according to the particular circuit design specification. In other examples, different numbers and types of connections may be made to compensate and/or provide a desired resistance for the routing path 822.

Figure 9:
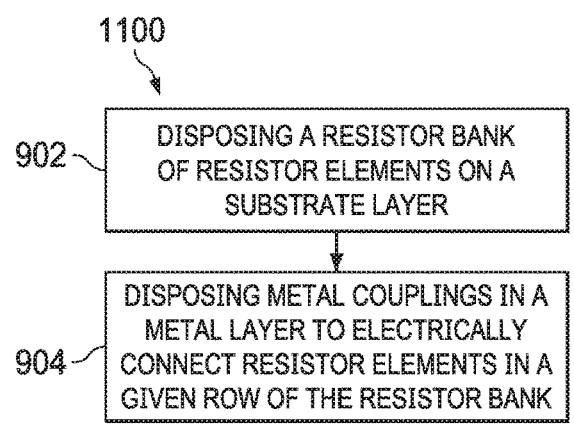
FIG. 9 is a flow chart illustrating another example method for fabricating an integrated circuit.

FIG. 9 illustrates an example method 900 for fabricating an integrated circuit with single level routing (in a metal layer) using a resistor. At 902, a resistor bank (e.g., resistor bank 800) is disposed in a polysilicon layer over a substrate layer. The resistor bank includes a plurality of resistor elements (e.g., elements 804, 806, 808) arranged in at least three columns and a plurality of rows of the resistor elements. Each resistor element includes a body portion extending in a longitudinal direction (e.g., the X-direction) of a respective row between first and second ends thereof. The columns thus extend in a direction (e.g., the Y-direction) that is transverse to the longitudinal direction.

At 904, the method includes disposing metal couplings in a metal layer over the polysilicon layer to electrically connect each of the resistor elements in a given row of the plurality of rows in series to provide an electrical routing path (e.g., routing path 822) across the given row of the resistor bank.

As a further example, a first set of metal couplings is disposed in the metal layer to electrically connect each of the resistor elements in a first column of the plurality of columns to provide an electrical connection having a resistance through the first column of the resistor bank. The resistance may depend on the type of connections between the resistor elements in first column. The electrical connection through the first column of the resistor bank is electrically coupled to the electrical routing path using a metal layer coupling. In another example, a second set of metal couplings is disposed in the metal layer to electrically connect each of the resistor elements in another column (e.g., a last column) of the plurality of columns to provide an electrical connection having a resistance through such other column of the resistor bank. The electrical connection through such other column is also electrically coupled to the electrical routing path using a metal layer coupling and at least one additional column of resistor elements residing between the first column and the other column of the resistor bank.

As a further example, a first terminal can be provided in the metal layer to couple to an end node of a resistor element in the first column and a first row that is distal from the given row. A second terminal can be provided in the metal layer coupled to an end node of a resistor element in the other column (e.g., last column) and the first row. In this way, the first and second terminals correspond to terminals of a resistor circuit having an aggregate resistance according to the resistance through the first column of the resistor bank, the resistance through the given row and the resistance through the other column of the resistor bank. This resistance may be set based on the number of resistors and the types of connections, as disclosed herein. As disclosed herein, the resistor circuit has a configuration that enables a routing connection (e.g., one or more connections 840) to be formed in the metal layer as to extend in a direction transverse to the longitudinal direction over the body portion of each of the resistor elements in one of the central columns (e.g., of main bank 802) of resistor elements, and including to extend over the body portion of a resistor element of the electrical routing path. Such routing connection thus can extend over the entire resistor bank 800, which is configured to provide a resistor circuiting having a known desired resistance between end terminals, and electrically connect to other circuitry (e.g., circuitry 810) that is spaced apart from the resistor bank in the transverse direction. The other end of the routing connection may be routed to another location on the IC chip.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit comprising:
a substrate layer;
a semiconductor layer on the substrate layer, the semiconductor layer comprising a resistor bank, the resistor bank comprising:
a first resistor having a first end and a second end;
a second resistor having a third end and a fourth end;
a third resistor having a fifth end and a sixth end;
a fourth resistor having a seventh end and an eighth end; and
a metal layer above the semiconductor layer, the metal layer comprising:
a metal line traversing the first resistor, the second resistor, the third resistor, and the fourth resistor;
a first coupling electrically connecting the first end of the first resistor and the seventh end of the fourth resistor;
a second coupling electrically connecting the fifth end of the third resistor and the third end of the second resistor; and
a third coupling electrically connecting the first coupling and the second coupling.

2. The integrated circuit of claim 1, wherein the first resistor has a resistance, the second resistor has the resistance, the third resistor has the resistance, and the fourth resistor has the resistance.

3. The integrated circuit of claim 1, wherein the metal layer further comprises a fourth coupling electrically connecting the eighth end of the fourth resistor to the second end of the first resistor.

4. The integrated circuit of claim 3, wherein the metal layer further comprises a fifth coupling electrically connecting the fourth end of the second resistor to the sixth end of the third resistor.

5. The integrated circuit of claim 4, wherein a resistance from the fifth coupling to the fourth coupling is a resistance, and the first resistor has the resistance.

6. The integrated circuit of claim 1, wherein the metal line is a first metal line, the integrated circuit further comprising a second metal line crossing the first resistor, the second resistor, the third resistor, and the fourth resistor.

7. The integrated circuit of claim 1, wherein the first resistor, the second resistor, the third resistor, and the fourth resistor are in a first column, the resistor bank further comprising a fifth resistor, a sixth resistor, and a seventh resistor in a second column.

8. The integrated circuit of claim 7, wherein the resistor bank further comprises an eighth resistor, a ninth resistor, and a tenth resistor in a third column.

9. The integrated circuit of claim 1, wherein the first resistor, the second resistor, the third resistor, and the fourth resistor are bandgap resistors.

10. The integrated circuit of claim 1, wherein the semiconductor layer is a polysilicon layer.

11. The integrated circuit of claim 1, wherein a first region is on a first side of the metal line, a second region is on a second side of the metal line, the first end of the first resistor, the third end of the second resistor, the fifth end of the third resistor, and the seventh end of the fourth resistor are in the first region and the second end of the first resistor, the fourth end of the second resistor, the sixth end of the third resistor, and the eighth end of the fourth resistor are in the second region.

12. An integrated circuit comprising:
a semiconductor layer comprising a resistor bank, the resistor bank comprising:
a first resistor having a first end and a second end;
a second resistor having a third end and a fourth end;
a third resistor having a fifth end and a sixth end; and
a fourth resistor having a seventh end and an eighth end; and
a metal layer above the semiconductor layer, the metal layer comprising:
a metal line traversing the first resistor, the second resistor, the third resistor, and the fourth resistor;
a first coupling electrically connecting the first end of the first resistor and the seventh end of the fourth resistor;
a second coupling electrically connecting the fifth end of the third resistor and the third end of the second resistor; and a third coupling electrically connecting the first coupling and the second coupling.

13. The integrated circuit of claim 12, wherein the first end of the first resistor, the seventh end of the third resistor, the third end of the second resistor, and the fifth end of the third resistor are on a side of the metal line.

14. The integrated circuit of claim 13, wherein the side of the metal line is a first side of the metal line, and wherein the eighth end of the fourth resistor, the second end of the first resistor, the fourth end of the second resistor, and the sixth end of the third resistor are on a second side of the metal line.

15. The integrated circuit of claim 12, the metal layer further comprising:
   a fourth coupling electrically connecting the second end of the first resistor to the eighth end of the fourth resistor; and
   a fifth coupling electrically connecting the sixth end of the third resistor to the fourth end of the second resistor.

16. The integrated circuit of claim 15, wherein a resistance from the fourth coupling to the fifth coupling is the same as the resistance of the first resistor.

17. An integrated circuit comprising:
   a semiconductor layer comprising a resistor bank, the resistor bank comprising:
      a first resistor having a first end and a second end;
      a second resistor having a third end and a fourth end;
      a third resistor having a fifth end and a sixth end; and
      a fourth resistor having a seventh end and an eighth end; and
   a metal layer above the semiconductor layer, the metal layer comprising:
      a metal line, a first coupling, a second coupling, a third coupling, a fourth coupling, and a fifth coupling, the first coupling electrically connecting the second end of the first resistor and the eighth end of the fourth resistor, the second coupling electrically connecting the sixth end of the third resistor and the fourth end of the second resistor, the third coupling electrically connecting the first end of the first resistor and the seventh end of the fourth resistor, the fourth coupling electrically connecting the fifth end of the third resistor and the third end of the second resistor, and the fifth coupling electrically connecting the third coupling and the fourth coupling.

18. The integrated circuit of claim 17, wherein the third coupling, the fourth coupling, and the fifth coupling are on a first side of the metal line and the first coupling and the second coupling are on a second side of the metal line.

19. The integrated circuit of claim 17, wherein a resistance from the second coupling to the third coupling is the same as a resistance of the first resistor.

20. The integrated circuit of claim 1, wherein the resistor bank further comprises a fifth resistor, the metal line traversing the fifth resistor, the fifth resistor between the first resistor and the third resistor.

* * * * *